United States Patent
Chiba et al.

(10) Patent No.: US 11,366,028 B2
(45) Date of Patent: Jun. 21, 2022

(54) STRESS SENSOR

(71) Applicants: Murata Manufacturing Co., Ltd., Nagaokakyo (JP); The University of Tokyo, Tokyo (JP)

(72) Inventors: Daichi Chiba, Tokyo (JP); Akira Ando, Nagaokakyo (JP)

(73) Assignees: MURATA MANUFACTURING CO., LTD., Kyoto (JP); THE UNIVERSITY OF TOKYO, Tokyo (JP)

( * ) Notice: Subject to any disclaimer, the term of this patent is extended or adjusted under 35 U.S.C. 154(b) by 420 days.

(21) Appl. No.: 16/538,929

(22) Filed: Aug. 13, 2019

(65) Prior Publication Data

US 2019/0360878 A1 Nov. 28, 2019

Related U.S. Application Data

(63) Continuation of application No. PCT/JP2018/004853, filed on Feb. 13, 2018.

(30) Foreign Application Priority Data

Feb. 20, 2017 (JP) .............................. JP2017-029314

(51) Int. Cl.
*H01F 10/32* (2006.01)
*G01R 33/09* (2006.01)
(Continued)

(52) U.S. Cl.
CPC .............. *G01L 1/12* (2013.01); *G01R 33/091* (2013.01); *G01R 33/093* (2013.01); *H01F 10/28* (2013.01);
(Continued)

(58) Field of Classification Search
None
See application file for complete search history.

(56) References Cited

U.S. PATENT DOCUMENTS

2001/0015878 A1* 8/2001 Varga .................... G01R 33/093
360/324.12
2004/0066674 A1* 4/2004 Tang ......................... G01L 9/16
365/200
(Continued)

FOREIGN PATENT DOCUMENTS

| JP | 2007-333408 A | 12/2007 |
| JP | 2012-204479 A | 10/2012 |
| JP | 2015-059932 A | 3/2015 |

OTHER PUBLICATIONS

Official Communication issued in International Patent Application No. PCT/JP2018/004853, dated May 15, 2018.

*Primary Examiner* — Kevin M Bernatz
(74) *Attorney, Agent, or Firm* — Keating & Bennett, LLP (57) ABSTRACT

A stress sensor includes a stress detection layer including a laminated body including a first magnetic layer, a first non-magnetic layer, and a second magnetic layer that are laminated, wherein the first magnetic layer and the second magnetic layer have mutually different magnetoelastic coupling constants, such that a stress is detected by an electrical resistance dependent on a relative angle of magnetization between the first magnetic layer and the second magnetic layer varying depending on the stress externally applied.

20 Claims, 9 Drawing Sheets

(51) Int. Cl.
    *H01F 10/28*    (2006.01)
    *G01L 1/12*     (2006.01)
(52) U.S. Cl.
    CPC ....... *H01F 10/325* (2013.01); *H01F 10/3259*
            (2013.01); *H01F 10/3286* (2013.01)

(56) References Cited

U.S. PATENT DOCUMENTS

| | | | |
|---|---|---|---|
| 2006/0067012 A1* | 3/2006 | Li | G11B 5/3929 |
| | | | 360/324.11 |
| 2006/0246271 A1 | 11/2006 | Quandt et al. | |
| 2007/0186666 A1 | 8/2007 | Ruehrig et al. | |
| 2008/0211491 A1* | 9/2008 | Huang | A61N 1/3787 |
| | | | 324/209 |
| 2012/0245477 A1 | 9/2012 | Giddings et al. | |
| 2015/0082900 A1* | 3/2015 | Fuji | G01L 9/007 |
| | | | 73/779 |
| 2016/0258824 A1* | 9/2016 | Fuji | G01B 7/24 |
| 2018/0003781 A1* | 1/2018 | Ban | H01F 10/3254 |
| 2021/0278292 A1* | 9/2021 | Ando | G01L 1/12 |

* cited by examiner

STRESS SENSOR

CROSS REFERENCE TO RELATED APPLICATIONS

This application claims the benefit of priority to Japanese Patent Application No. 2017-029314 filed on Feb. 20, 2017 and is a Continuation Application of PCT Application No. PCT/JP2018/004853 filed on Feb. 13, 2018. The entire contents of each application are hereby incorporated herein by reference.

BACKGROUND OF THE INVENTION

1. Field of the Invention

The present invention relates to a stress sensor.

2. Description of the Related Art

As a conventional stress sensor, for example, there is known a method of using a resistor arranged to extend in a fixed direction as a sensor segment to detect a stress from a change in resistance value when this resistor is deformed by the stress in the longitudinal direction thereof (for example, see Japanese Patent Application Laid-Open No. 2007-333408).

Japanese Patent Application Laid-Open No. 2007-333408 discloses a stress sensor as an example of a stress sensor using the above method, which aims to obtain a target stress calculation value accurately without being affected by temperature. Specifically, Japanese Patent Application Laid-Open No. 2007-333408 discloses a stress sensor provided with a substrate and a resistor for a sensor element formed on the substrate, where the resistor for the sensor element is combined with three other resistor elements to form a bridge circuit. Japanese Patent Application Laid-Open No. 2007-333408 also discloses that one resistor element among the three other resistor elements is formed on the substrate as a temperature-compensating resistor made of a material having the same or substantially the same resistance temperature coefficient as the resistor for the sensor element (see Abstract).

However, although such a conventional stress sensor is able to detect the magnitude of a stress by the single element, there is a problem that a detectable direction of the stress is limited. Therefore, two or more sensors need to be used together in order to be able to detect a stress in any in-plane direction of a stress sensor.

SUMMARY OF THE INVENTION

Preferred embodiments of the present invention provide stress sensors that are each capable of detecting a stress in any in-plane direction by a single element.

A stress sensor according to a preferred embodiment of the present invention includes a stress detection layer including a laminated body including a first magnetic layer, a first non-magnetic layer, and a second magnetic layer that are laminated, wherein the first magnetic layer and the second magnetic layer have mutually different magnetoelastic coupling constants, such that a stress is detected by an electrical resistance dependent on a relative angle of magnetization between the first magnetic layer and the second magnetic layer varying depending on the stress that is externally applied.

According to preferred embodiments of the present invention, stress sensors are provided that are each capable of detecting a stress in any in-plane direction by a single element.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Preferred embodiments will be described in detail below with reference to the drawings.

First Preferred Embodiment

Figure 1:
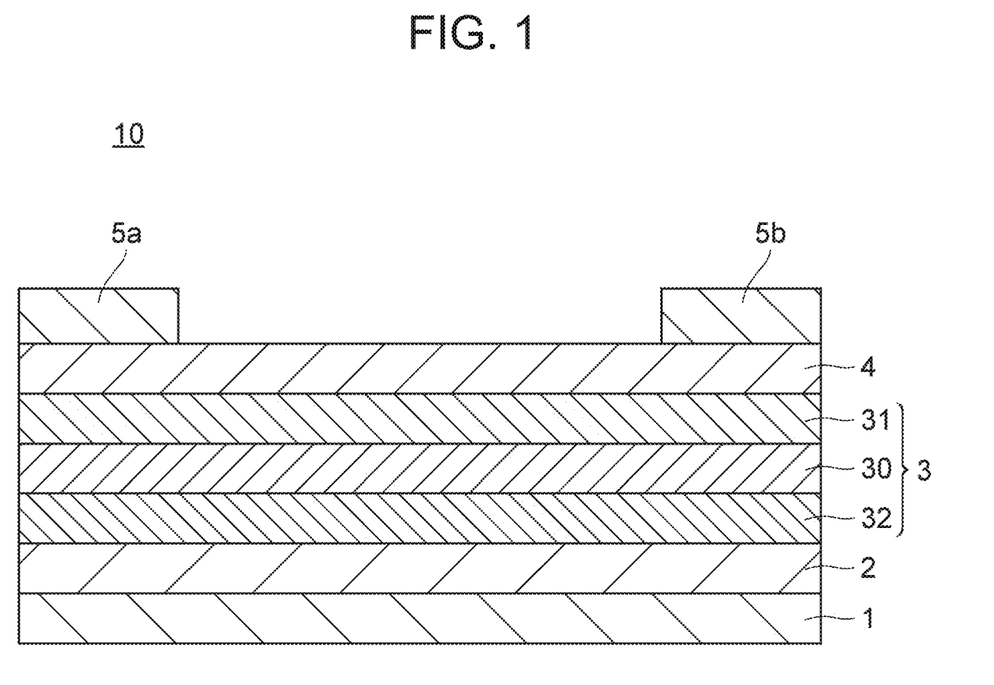
FIG. 1 is a schematic cross-sectional view of a stress sensor according to first and second preferred embodiments of the present invention.

FIG. 1 is a cross-sectional view of a stress sensor according to a first preferred embodiment of the present invention.

As illustrated in FIG. 1, a stress sensor 10 includes a substrate 1, a base layer 2 on the substrate 1, a stress detection layer 3 on the base layer 2, a protective layer 4 on the stress detection layer 3, and electrodes 5a, 5b on the protective layer 4.

The substrate 1 is preferably a resin substrate, and use of a flexible substrate having flexibility and elasticity may be applied to a sensor to sense the movement of a human body, and the like. As such a flexible substrate, for example, a substrate made of polyester, polycarbonate, or polyimide is preferably used.

The base layer 2 determines the crystal orientation of the stress detection layer 3, and improves the adhesion of magnetic layers in the stress detection layer 3 to the substrate 1, which may be any non-magnetic body. For example, the base layer 2 is preferably made of Pt, Cu, Ta, Au, and the like as 3d, 4d, 5d transition metal non-magnetic materials. Further, the base layer 2 may also be an insulator, for example, made of silicon oxide, silicon nitride, aluminum oxide, or magnesium oxide.

The stress detection layer 3 is preferably a laminated body including a first magnetic layer 31, a first non-magnetic layer 30, and a second magnetic layer 32 from top to bottom. Though not illustrated, the stress detection layer 3 may further include a laminated body on the top layer or the bottom layer of the above-described laminated body, where the laminated body is formed by laminating one or more structures each made of a second non-magnetic layer and a third magnetic layer. Although the number of laminated structures each made of the additional second non-magnetic layer and third magnetic layer is not particularly limited, it is preferably about 50, for example. The second non-magnetic layer and third magnetic layer may further include a laminated body formed by laminating one or more structures each made of a non-magnetic layer and a magnetic layer different in material and thickness from each other. Thus, the stress detection layer 3 has a structure such that a plurality of magnetic layers are laminated with each non-magnetic layer sandwiched therebetween.

The first magnetic layer 31 and the second magnetic layer have different magnetoelastic coupling constants B. The magnetization directions (magnetic moments) of the first magnetic layer 31 and the second magnetic layer 32 are parallel or substantially parallel, or antiparallel or substantially antiparallel to each other in an initial state where no stress is applied. Making the magnetization directions parallel or substantially parallel, or antiparallel or substantially antiparallel in the initial state is able to be achieved, for example, by forming the film of the stress detection layer 3 in a magnetic field or by the shape effect of processing the element into a slender shape to provide a uniaxial magnetic anisotropy.

Either one of the first magnetic layer 31 and the second magnetic layer 32 is a strain-insensitive layer, and the other is a strain-sensitive layer. The strain-insensitive layer is a layer in which the magnetization direction of the strain-insensitive layer does not substantially change even when a stress (strain) is applied, and the strain-sensitive layer is a layer in which, when a stress (strain) is applied, the magnetization direction of the strain-sensitive layer is turned to be parallel or substantially parallel, or perpendicular or substantially perpendicular to the strain direction. In the case of B>0, the magnetization direction of the strain-sensitive layer is turned to be parallel or substantially parallel to the strain direction, while in the case of B<0, the magnetization direction of the strain-sensitive layer is turned to be perpendicular or substantially perpendicular to the strain direction. When providing a definition from a value relative to the strain-sensitive layer, the strain-insensitive layer is defined such that the magnetoelastic coupling constant B is sufficiently smaller than that of the strain-sensitive layer, preferably such that the absolute value of the magnetoelastic coupling constant of the strain-insensitive layer is about ⅕ or less, for example, of the magnetoelastic coupling constant of the strain-sensitive layer. Further, when providing a definition from the absolute value of the magnetoelastic coupling constant, it is preferable that the absolute value of the magnetoelastic coupling constant of the strain-insensitive layer is substantially 0, that is, it is preferable to be as close to 0 as possible, which specifically means about 0.5 $MJ/m^3$ or less, about 0.4 $MJ/m^3$ or less, about 0.3 $MJ/m^3$ or less, about 0.2 $MJ/m^3$ or less, or about 0.1 $MJ/m^3$ or less, for example. It is also preferable that the absolute value of the magnetoelastic coupling constant of the strain-sensitive layer is about 1 $MJ/m^3$ or more, for example. Note that the stress (strain) includes various stresses such as tension, compression, deflection, and the like.

The magnetic layer is made of metallic (including alloy) magnetic materials, preferably of 3 d transition metal ferromagnetic materials such as Fe, Co, and Ni and an alloy containing Fe, Co, or Ni, for example.

The first magnetic layer 31 and the second magnetic layer 32 may be made of the same magnetic materials or different magnetic materials. Further, the first magnetic layer 31 and the second magnetic layer 32 may have the same thickness or different thicknesses. When the first magnetic layer 31 and the second magnetic layer 32 are made of the same materials but have different film thicknesses, the first magnetic layer 31 and the second magnetic layer 32 have mutually different magnetoelastic coupling constants B. Further, even when the first magnetic layer 31 and the second magnetic layer 32 are made of the same in material and have the same film thickness as each other, if the materials of non-magnetic layers (containing the protective layer or the base layer) in contact with the top and bottom of the first magnetic layer 31 and the second magnetic layer 32 are different, the first magnetic layer 31 and the second magnetic layer 32 will have different magnetoelastic coupling constants B. Further, when the third magnetic layer is provided, the third magnetic layer may be made of the same materials as or different materials from the first magnetic layer and the second magnetic layer, and may have the same thickness as or a different thickness from the first magnetic layer and the second magnetic layer.

The film thickness of the magnetic layer including the first magnetic layer 31 and the second magnetic layer 32 is preferably set to be about 30 nm or less, for example. Thus, since the film thickness of the magnetic layer is as thin as about 30 nm or less, the magnetic layer demonstrates a property to stretch or contract by a stress and return to the original state after the stress disappears. Note that the first magnetic layer and the second magnetic layer may be formed by laminating different kinds of metal magnetic layers. Further, when the first magnetic layer is a strain-insensitive layer, an antiferromagnetic layer made of NiFe or the like, for example, may be provided between the first magnetic layer and the protective layer, while when the second magnetic layer is a strain-insensitive layer, the antiferromagnetic layer may be provided between the second magnetic layer and the base layer. The arrangement of the antiferromagnetic layer makes it easy to fix the magnetization of the insensitive layer in one direction while keeping the single-domain state (exchange bias type). It is preferable that the thickness of the antiferromagnetic layer is not less than about 3 nm and not more than about 30 nm, for example.

The first non-magnetic layer 30 may be any non-magnetic body, which is made of 3d, 4d, 5d transition metal non-magnetic materials, such as Pt, Cu, Ta, Au, and the like, for example. The first non-magnetic layer 30 may also be an insulator, which is made of, for example, silicon oxide, silicon nitride, aluminum oxide, magnesium oxide, or the like. The thickness of the first non-magnetic layer 30 is preferably about 10 nm or less, for example. Further, when a second non-magnetic layer is provided, the second non-magnetic layer may be made of the same materials as or different materials from the first non-magnetic layer, and may have the same thickness as or a different thickness from the first non-magnetic layer.

The protective layer 4 protects the stress detection layer 3, which may be made of any materials as long as it is a non-magnetic body. For example, the protective layer 4 may preferably be made of, for example, Pt, Cu, Ta, Au, and the like as 3d, 4d, 5d transition metal non-magnetic materials.

The materials of the electrodes 5a, 5b are not particularly limited. For example, metals of Pt, Cu, Ag, Au, Al, Cr, Ti, and the like, or conductors containing these metals may preferably be used. An electric current is supplied to the stress detection layer 3 through the electrodes 5a, 5b to detect the electric resistance value of the stress detection layer 3. In the present preferred embodiment, the electrodes 5a, 5b are provided above the stress detection layer 3. When a voltage is applied between the electrode 5a and the electrode 5b, since the electric current eventually flows through the entire thickness of the stress detection layer 3, a giant magnetoresistance effect to be described later is detectable.

Figure 2A:
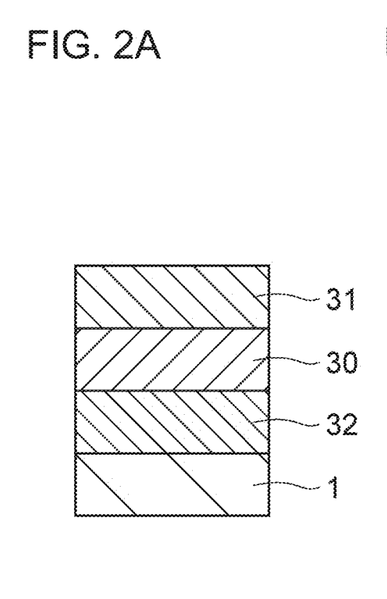
FIGS. 2A to 2D are diagrams for describing a relationship between the relative angle of magnetization and the electrical resistance in the stress sensor according to the preferred embodiments of the present invention.
Figure 2B:
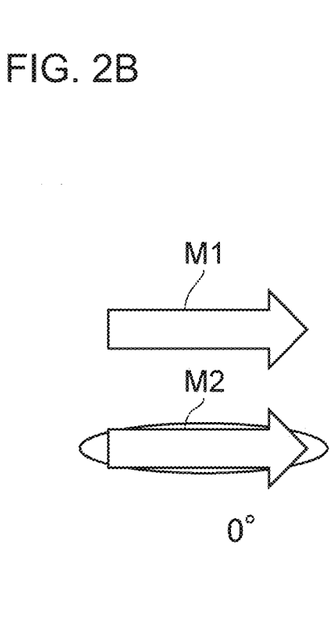
Figure 2C:
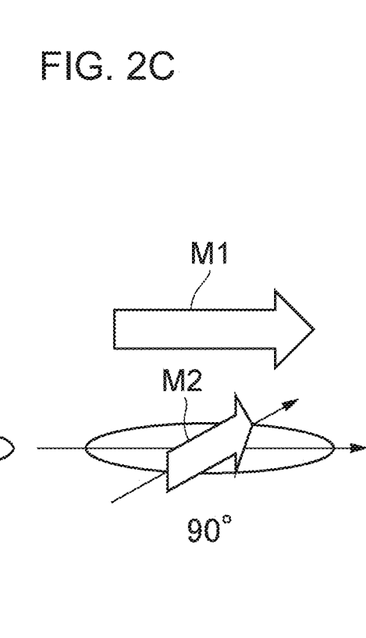
Figure 2D:
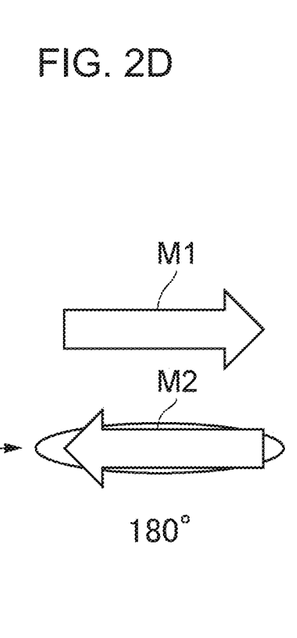

FIGS. 2A to 2D are diagrams for describing a relationship between the relative angle of magnetization and the electrical resistance in the stress sensor according to the present preferred embodiment. FIG. 2A illustrates a basic element structure, FIG. 2B illustrates a case where the relative angle of magnetization is about 0° (low resistance state), FIG. 2C illustrates a case where the relative angle of magnetization (angle between M1 and M2) is about 90° (middle resistance state), and FIG. 2D illustrates a case where the relative angle of magnetization is about 180°. The magnetization direction (magnetic moment) of the first magnetic layer 31 is denoted by M1, and the magnetization direction of the second magnetic layer 32 is denoted by M2.

In the stress sensor according to the present preferred embodiment, the value of electrical resistance detected when the electric current flows in the plane varies depending on the relative angle of magnetization between the first magnetic layer 31 and the second magnetic layer 32 (FIG. 2B to 2D). The electric resistance value of the stress detection layer 3 becomes a low resistance state when the relative angle of magnetization is about 0° as illustrated in FIG. 2B, the electric resistance value of the stress detection layer 3 becomes a middle state (between the low resistance state and a high resistance state) when the relative angle of magnetization exceeds 0° but is less than about 180° as illustrated in FIG. 2C (the case of about 90° is illustrated in FIG. 2C as an example), and the stress detection layer 3 becomes a high resistance state when the relative angle of magnetization is about 180° as illustrated in FIG. 2D. Thus, the electric resistance value of the stress detection layer 3 becomes a different value depending on the relative angle of magnetization. This is called the giant magnetoresistance effect (2007 Nobel Physics Prize), and it is generally known that the magnetoresistance change rate increases as the number of laminations of the magnetic layers/non-magnetic layers increases. The stress sensor according to the present preferred embodiment uses the giant magnetoresistance effect.

Figure 3:
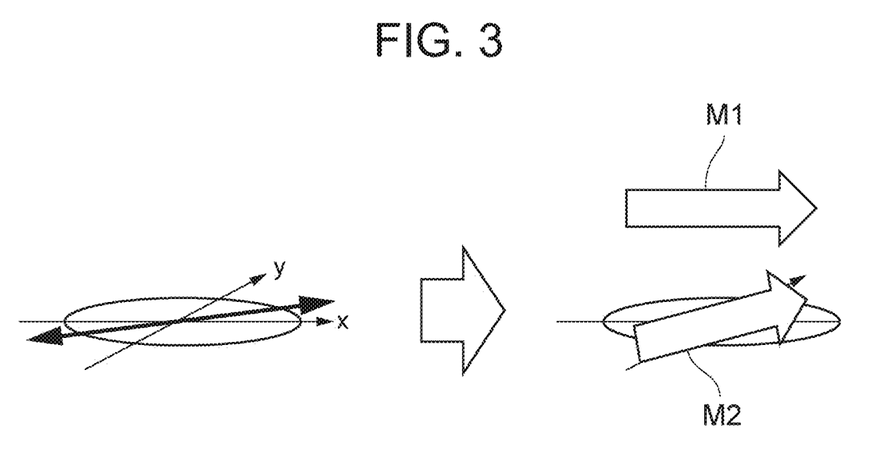
FIG. 3 is a diagram for describing the operation of the stress sensor according to the first preferred embodiment of the present invention.

Referring next to FIG. 3, a stress detection method using the stress sensor according to the present preferred embodiment will be described.

For example, the stress sensor is designed such that the first magnetic layer 31 is a strain-insensitive layer, the second magnetic layer 32 is a strain-sensitive layer, and the magnetization directions (magnetic moments) of the first magnetic layer 31 and the second magnetic layer 32 are parallel or substantially parallel (the low resistance state in FIG. 2B) or antiparallel or substantially antiparallel (the high resistance state in FIG. 2D) in the initial state. In this state, when a stress acts in the plane of the stress sensor 10, the second magnetic layer 32 as the strain-sensitive layer reacts sensitively to a strain and the magnetization direction thereof is turned to be parallel or substantially parallel (in the case of B>0) or perpendicular or substantially perpendicular (in the case of B<0) to the strain direction (stress direction), whereas the first magnetic layer 31 as the strain-insensitive layer is insensitive to the strain and the magnetization direction thereof does not change.

For example, as illustrated in FIG. 3, a tensile stress is applied in a direction about 30° from the x axis. In this case, when the magnetoelastic coupling constant B of the second magnetic layer 32 as the strain-sensitive layer is positive, the magnetization direction of the second magnetic layer 32 becomes parallel or substantially parallel to the stress direction, and the relative angle of magnetization between the first magnetic layer 31 and the second magnetic layer 32 changes to about 30°. Thus, a finite angle is generated between the first magnetic layer and the second magnetic layer 32 in terms of the axis of magnetization direction depending on the strain direction to indicate an electric resistance value according to the relative angle by the giant magnetoresistance effect. The relative angle of magnetization may be detected by detecting the electric resistance value at the electrodes 5a, 5b, and thus, a strain vector direction is able to be detected.

As described above, according to the stress sensor of the first preferred embodiment, a stress in any in-plane direction is able to be detected by a single element. In particular, according to the stress sensor of the first preferred embodiment, the stress vector direction is able to be detected by a single element.

Second Preferred Embodiment

In a second preferred embodiment of the present invention, a description of the matters common to the first preferred embodiment will be omitted, and only different points will be described. The cross-sectional view of the stress sensor according to the second preferred embodiment is as illustrated in FIG. 1.

In the second preferred embodiment, either one of the first magnetic layer 31 and the second magnetic layer 32 has a positive magnetoelastic coupling constant, and the other one has a negative magnetoelastic coupling constant. For example, the magnetoelastic coupling constant of the first magnetic layer 31 is preferably negative, and the magnetoelastic coupling constant of the second magnetic layer 32 is preferably positive. In other words, when a stress (strain) acts on the stress sensor 10, the magnetization direction of the first magnetic layer 31(B<0) is turned to be perpendicular or substantially perpendicular to the strain direction, and the magnetization direction of the second magnetic layer 32 (B>0) is turned to be parallel or substantially parallel to the strain direction. It is preferable that the absolute value of the magnetoelastic coupling constants of the first magnetic layer 31 and the second magnetic layer 32 are about 1 MJ/m$^3$ or more, for example.

Figure 4:
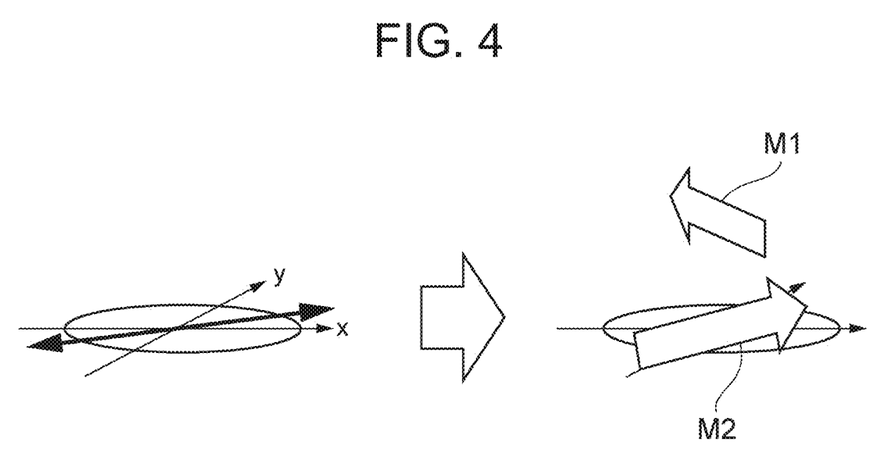
FIG. 4 is a diagram for describing the operation of the stress sensor according to the second preferred embodiment of the present invention.

Referring next to FIG. 4, a stress detection method using the stress sensor according to the present preferred embodiment will be described.

First, the stress sensor is designed such that the magnetization directions (magnetic moments) of the first magnetic layer 31 and the second magnetic layer 32 are parallel or substantially parallel (the low resistance state in FIG. 2B) or antiparallel or substantially antiparallel (the high resistance state in FIG. 2D) in the initial state where no stress is applied. In this state, when a stress acts in the plane of the stress sensor 10, the magnetization direction of the first magnetic layer 31 whose magnetoelastic coupling constant B is negative is turned to be perpendicular or substantially perpendicular to the strain direction (stress direction), and the magnetization direction of the second magnetic layer 32 whose magnetoelastic coupling constant B is positive is turned to be parallel or substantially parallel to the strain direction (stress direction).

As illustrated in FIG. 4, for example, when a tensile stress is applied in any direction, the magnetization direction of the first magnetic layer 31 becomes perpendicular or substantially perpendicular to the stress direction, the magnetization direction of the second magnetic layer 32 becomes parallel or substantially parallel to the stress direction, and the relative angle of magnetization between the first magnetic layer 31 and the second magnetic layer 32 changes to about 90°. Thus, when a stress acts in any direction, the relative angle of magnetization between the first magnetic layer 31 and the second magnetic layer 32 becomes about 90° to indicate an electric resistance value according to the relative angle by the giant magnetoresistance effect. The presence or absence of a stress is able to be detected by detecting the electric resistance value at the electrodes 5a, 5b.

As described above, according to the stress sensor of the second preferred embodiment, a stress in any in-plane direction is able to be detected by a single element.

Third Preferred Embodiment

In a third preferred embodiment of the present invention, a description of the matters common to the first preferred embodiment will be omitted, and only different points will be described.

Figure 5:
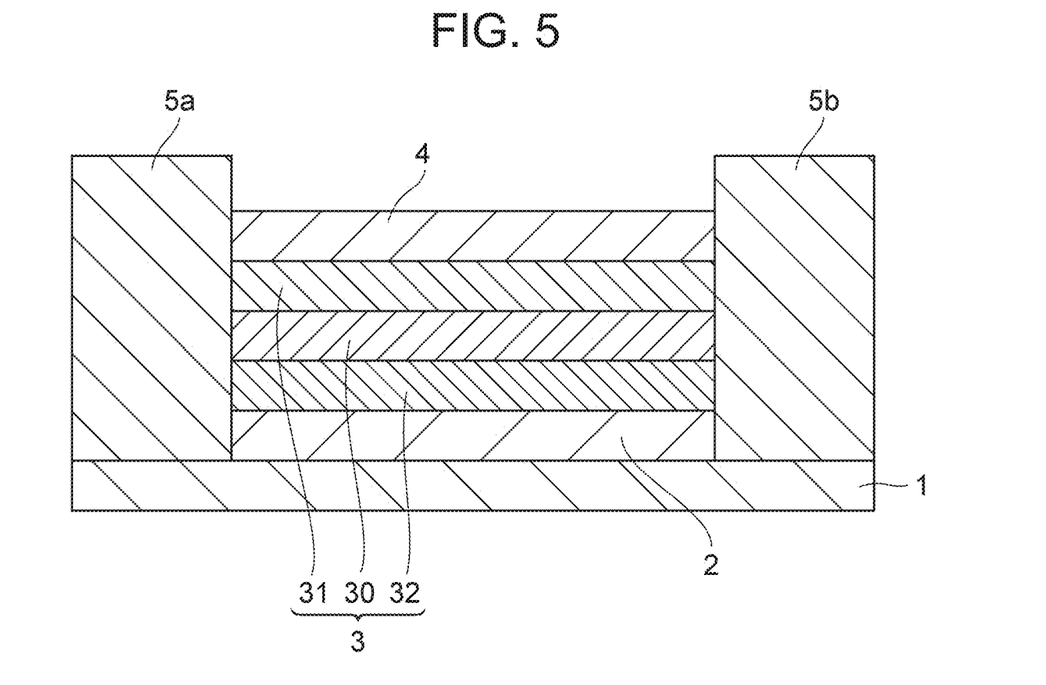
FIG. 5 is a schematic cross-sectional view of a stress sensor according to a third preferred embodiment of the present invention.

FIG. 5 is a schematic cross-sectional view of a stress sensor according to the third preferred embodiment. As illustrated in FIG. 5, electrodes 5a, 5b are provided on the sides of the stress detection layer 3 in the third preferred embodiment. The structure is the same or substantially the same as that in the first and second preferred embodiments, except for the arrangement of the electrodes 5a, 5b and that an insulator may be used as the protective layer 4. When the insulator is used as the protective layer 4, for example, silicon oxide, silicon nitride, aluminum oxide, or magnesium oxide may preferably be used.

The arrangement of the electrodes 5a, 5b illustrated in FIG. 5 may also detect the above-described giant magnetoresistance effect because an electric current eventually flows through the entire thickness of the stress detection layer 3 when a voltage is applied between the electrode 5a and the electrode 5b.

Thus, even in the arrangement of the electrodes 5a, 5b illustrated in FIG. 5, the same or substantially the same advantageous effects as those of the first preferred embodiment and the second preferred embodiment are able to be achieved. Note that, when the size of the element in the in-plane direction approximates the total film thickness (about 10 nm to about 300 nm, for example) of the metal layers, the arrangement of the electrodes 5a, 5b illustrated in FIG. 1 is likely to generate an electric current density distribution in a direction perpendicular or substantially perpendicular to the film surface of the stress detection layer 3, whereas in the arrangement of the electrodes 5a, 5b illustrated in FIG. 5, the electric current flows evenly.

Fourth Preferred Embodiment

In a fourth preferred embodiment of the present invention, a description of the matters common to the first preferred embodiment will be omitted, and only different points will be described.

Figure 6:
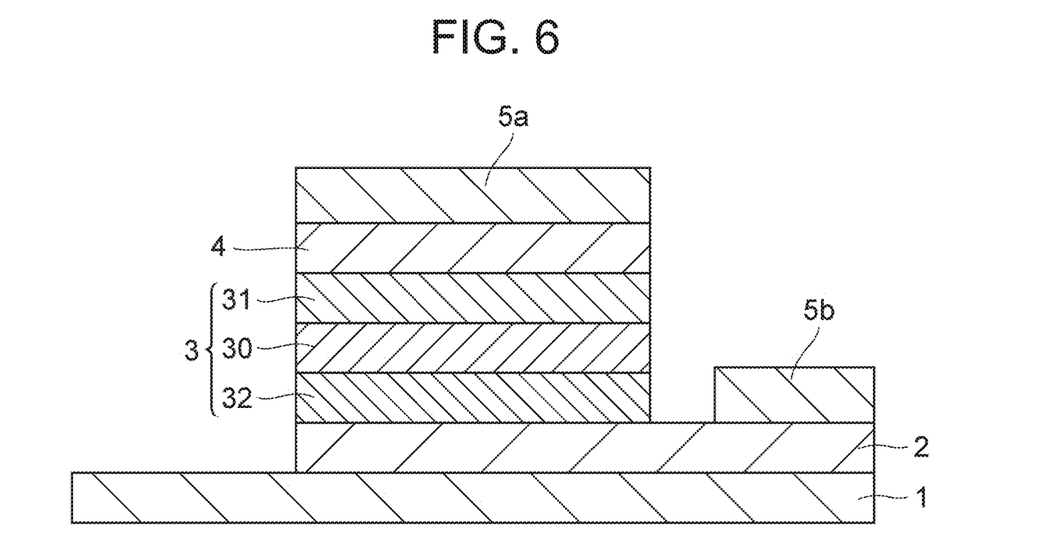
FIG. 6 is a schematic cross-sectional view of a stress sensor according to a fourth preferred embodiment of the present invention.

FIG. 6 is a schematic cross-sectional view of a stress sensor according to the fourth preferred embodiment. As illustrated in FIG. 6, in the fourth preferred embodiment, an electrode 5a is provided on the protective layer 4, a portion of the base layer 2 is exposed, and an electrode 5b is provided on the exposed base layer 2. The fourth preferred embodiment is the same or substantially the same as the first and second preferred embodiments except for the arrangement of the electrodes 5a, 5b and that an insulator may be used as a non-magnetic layer 30. The non-magnetic layer 30 may be defined by an insulator, for example, using silicon oxide, silicon nitride, aluminum oxide, or magnesium oxide. It is preferable that the thickness of the non-magnetic layer 30 defined by the insulator should be thin enough to allow a tunnel electric current to flow, i.e., it is preferable to be set to about 5 nm or less, for example.

The arrangement of the electrodes 5a, 5b illustrated in FIG. 6 may cause the electric current to flow perpendicularly or substantially perpendicularly to the stress detection layer 3. Even in the arrangement of the electrodes 5a, 5b illustrated in FIG. 6, the above-described giant magnetoresistance effect is able to be detected because the electric current eventually flows through the entire thickness of the stress detection layer 3 when a voltage is applied between the electrode 5a and the electrode 5b. Further, when the arrangement illustrated in FIG. 6 includes the insulator for the non-magnetic layer 30, the arrangement of the electrodes 5a, 5b is able to detect a tunnel magnetoresistance effect in which the relative angle of magnetization is reflected in the resistance as in the giant magnetoresistance effect.

As described above, even in the arrangement of the electrodes 5a, 5b illustrated in FIG. 6, the same or substantially the same advantageous effects as those of the first preferred embodiment and the second preferred embodiment are able to be achieved. Note that the arrangement of the electrodes 5a, 5b illustrated in FIG. 6 may obtain a particularly high magnetoresistance change rate compared with those of the first preferred embodiment and the second preferred embodiment, and thus a highly sensitive sensor is able to be manufactured.

The present invention will be described further specifically with reference to examples of preferred embodiments of the present invention, but the present invention is not limited to these examples.

Figure 7:
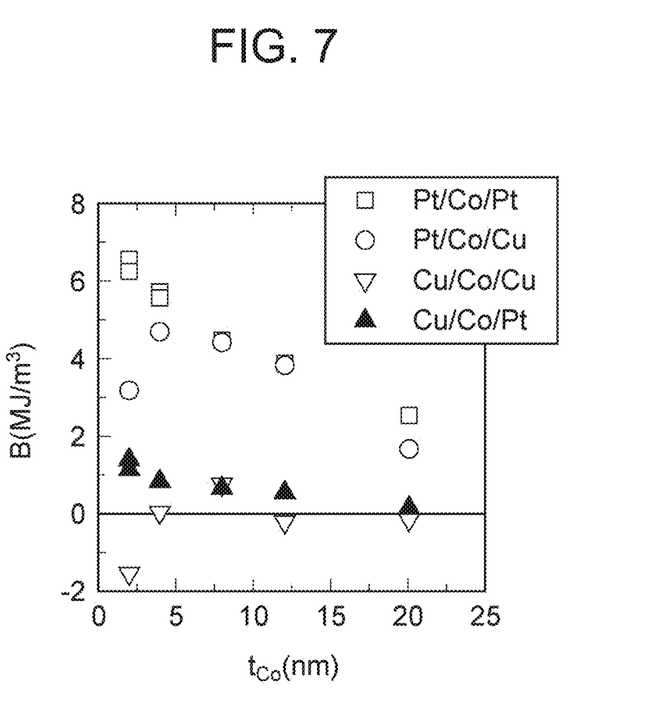
FIG. 7 is a chart illustrating magnetoelastic coupling constants when a Co film is sandwiched between various non-magnetic layers.

FIG. 7 is a graph illustrating the measurement results of magnetoelastic coupling constants when a ferromagnetic Co (cobalt) film is sandwiched between various non-magnetic metals as non-magnetic materials. In FIG. 7, the ordinate represents Co film thickness (nm) and the abscissa represents magnetoelastic coupling constant B (MJ/m3). FIG. 7 represents the dependence of the magnetoelastic coupling constant on the Co film thickness in samples having four types of membrane structures obtained by laminating Pt/Co/Pt, Pt/Co/Cu, Cu/Co/Cu, and Cu/Co/Pt in this order from the side of the substrate.

Although the magnetoelastic coupling constant B of a bulk magnetic body is determined by the materials, it was discovered from the graph illustrated in FIG. 7 that the magnetoelastic coupling constant B depends on the combination with a non-magnetic body to be laminated, or on the film thickness of the magnetic layer itself. Thus, combinations with non-magnetic bodies to be laminated or the film thicknesses of the magnetic layers may be selected to obtain the first magnetic layer 31 and the second magnetic layer 32 having the magnetoelastic coupling constants described in the first preferred embodiment and the second preferred embodiment.

Example 1

A stress sensor in an Example 1 is formed by laminating, on the substrate, a Ta layer (base layer), a 2 nm Cu layer (non-magnetic layer), a 4 nm Co layer (strain-insensitive layer), a 4 nm Cu layer (non-magnetic layer), a 2 nm Co layer (strain-sensitive layer), and a 2 nm Pt layer (non-magnetic layer or protective layer) in this order from the bottom layer. According to the graph illustrated in FIG. 7, the Co magnetoelastic coupling constant B=0 in the lower layer of the Cu/Co(4 nm)/Cu laminated body and the Co magnetoelastic coupling constant B>0 in the upper layer of the Cu/Co (2 nm)/Pt laminated body in such a laminated structure, thus achieving the combination of the strain-sensitive layer and the strain-insensitive layer in the first preferred embodiment. According to the Example 1, an element structure of the type that is able to detect the stress vector direction is achieved.

Example 2

A stress sensor in an Example 2 is formed by laminating, on the substrate, a Ta layer (base layer), a 2 nm Cu layer (non-magnetic layer), a 2 nm Co layer (strain-sensitive layer), a 4 nm Cu layer (non-magnetic layer), a 2 nm Co layer (strain-sensitive layer), and a 2 nm Pt layer (non-magnetic layer or protective layer) in this order from the bottom layer. According to the graph illustrated in FIG. 7, the Co magnetoelastic coupling constant B<0 in the lower layer of the Cu/Co(2 nm)/Cu laminated body and the Co magnetoelastic coupling constant B>0 in the upper layer of the Cu/Co (2 nm)/Pt laminated body in such a laminated structure, thus achieving the combination of different plus/minus signs of the magnetoelastic coupling constants in the second preferred embodiment. According to the Example 2, an element structure of the type that resistance increases even in which in-plane direction a tensile force is applied is achieved.

Example 3

Figure 8:
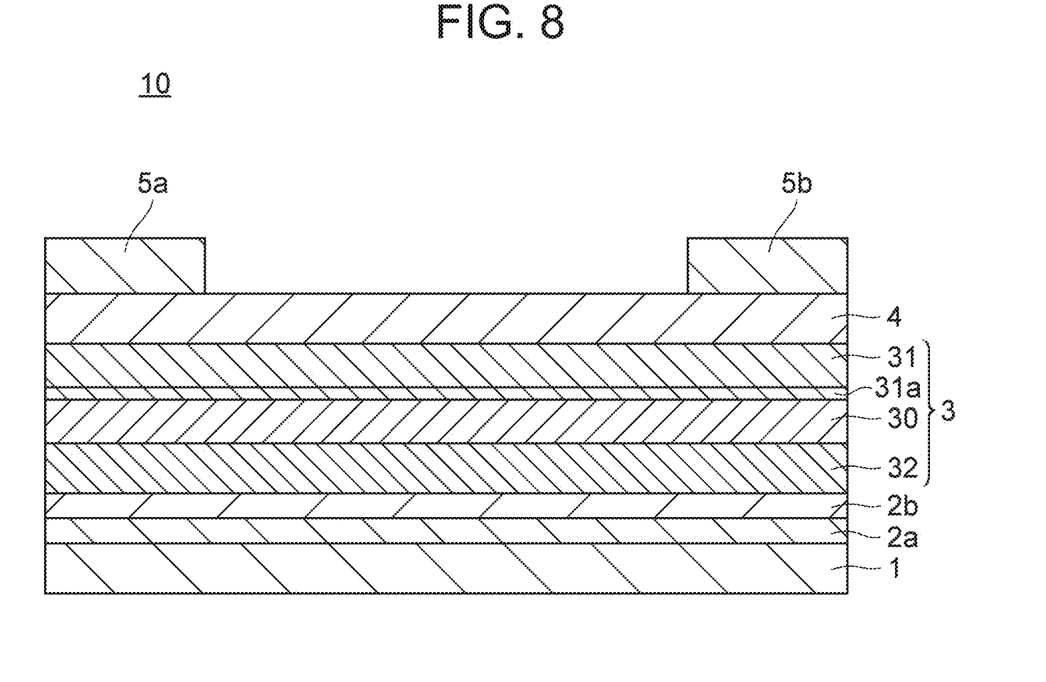
FIG. 8 is a view illustrating the structure of a stress sensor in an Example 3 of a preferred embodiment of the present invention.
Figure 9:
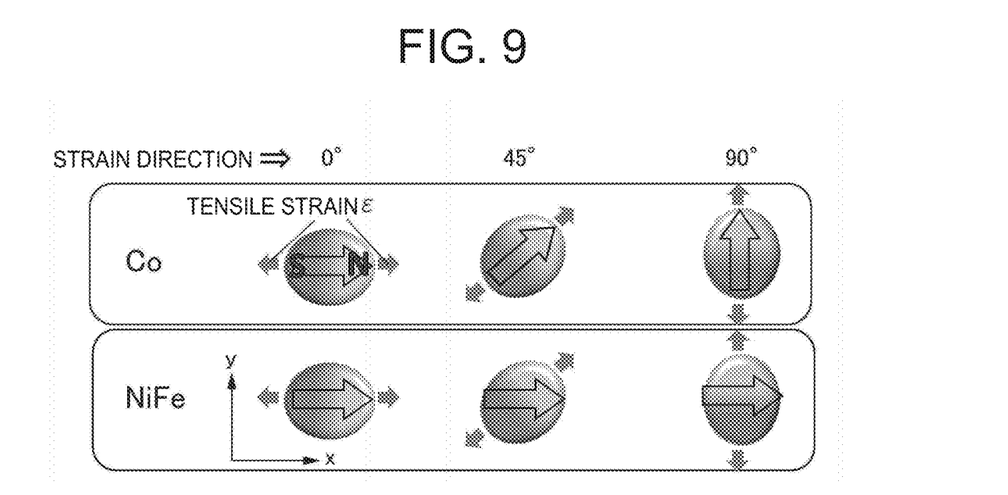
FIG. 9 is a diagram illustrating the operation of the stress sensor in the Example 3.

FIG. 8 is a view illustrating the structure of a stress sensor in an Example 3.
The material and film thickness of each of layers in the stress sensor illustrated in FIG. 8 are as follows:
Substrate 1: polyethylene naphthalate
Base layer 2a: about 2.5 nm Ta
Base layer 2b: about 2.0 nm Pt
Second magnetic layer 32: about 3.5 nm Co (strain-sensitive layer)
First non-magnetic layer 30: about 4.0 nm Cu
Additional first magnetic layer 31a: about 0.4 nm Co
First magnetic layer 31: about 3.8 nm NiFe (strain-insensitive layer)
Protective layer 4: about 2.0 nm Cu
Electrodes 5a, 5b: conductive epoxy resin A resistance change when a tensile strain of $\varepsilon=1.0\%$ is applied to the stress sensor in the Example 3 is measured. In the example, as illustrated in FIG. 9, the magnetization direction of the NiFe layer as the strain-insensitive layer does not change even when a stress is applied, whereas the Co layer as the strain-sensitive layer is turned to be parallel or substantially parallel to the stress direction.

Figure 10:
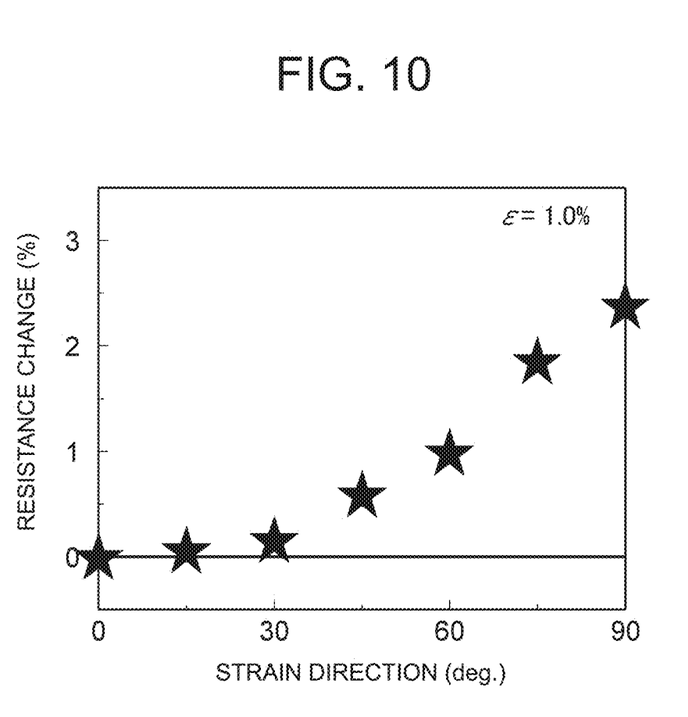
FIG. 10 is a chart illustrating a relationship between the strain direction and the resistance change of the stress sensor in the Example 3.

FIG. 10 illustrates a relationship between the direction of a tensile strain (strain direction) and the resistance change. As illustrated in FIG. 10, since a change in the magnetization direction of the Co layer as the sensitive layer causes a resistance change according to the strain direction, the strain direction is able to be detected.

Example 4

Figure 11:
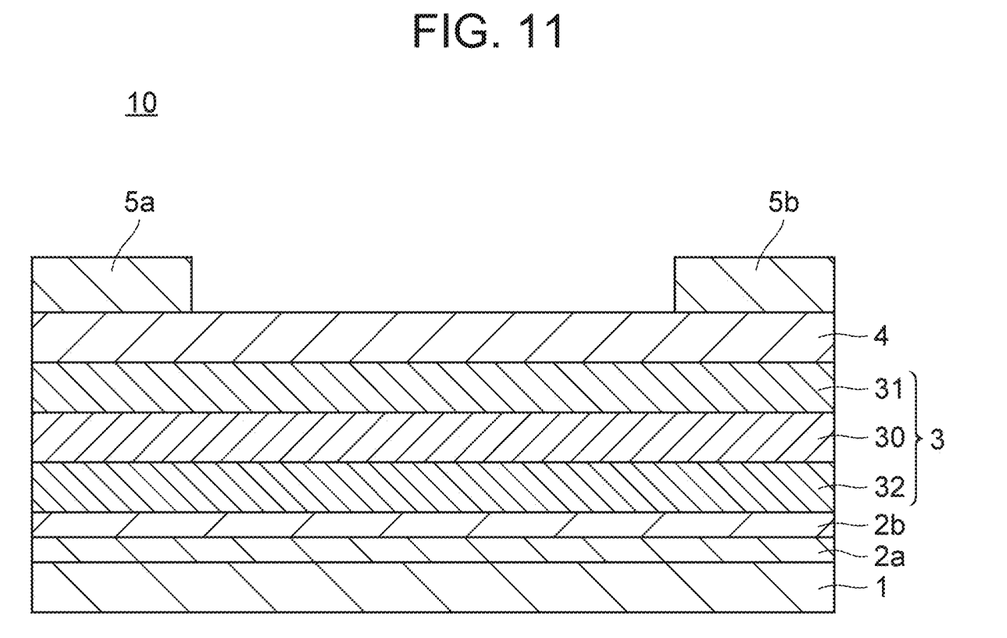
FIG. 11 is a view illustrating the structure of a stress sensor in an Example 4 of a preferred embodiment of the present invention.
Figure 12:
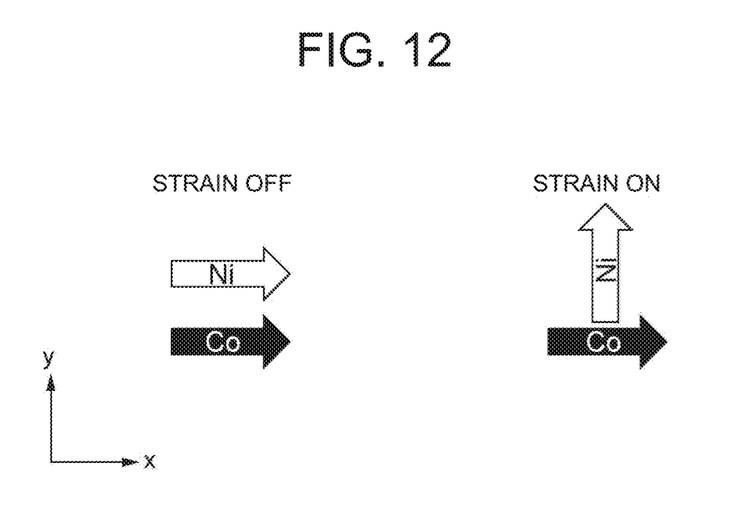
FIG. 12 is a diagram illustrating the operation of the stress sensor in the Example 4.

FIG. 11 is a view illustrating the structure of a stress sensor in an Example 4.
The materials and film thickness of each layers in the stress sensor illustrated in FIG. 11 are as follows:
Substrate 1: polyethylene naphthalate
Base layer 2a: about 2.5 nm Ta
Base layer 2b: about 1.7 nm Pt
Second magnetic layer 32: about 3.5 nm Co (strain-sensitive layer B>0)
First non-magnetic layer 30: about 4.0 nm Cu
First magnetic layer 31: about 4.0 nm Ni (strain-sensitive layer B<0)
Protective layer 4: about 1.7 nm Pt
Electrodes 5a, 5b: conductive epoxy resin In the Example 4, the magnetoelastic coupling constant B of the Co layer as the strain-sensitive layer is B>0, and the magnetoelastic coupling constant B of the Ni layer as the strain-sensitive layer is B<0. As illustrated in FIG. 12, when a stress is applied, the magnetization direction of the Co layer having B>0 is turned to be parallel or substantially parallel to the strain direction, whereas the magnetization direction of the Ni layer having B<0 is turned to be perpendicular or substantially perpendicular to the strain direction.

Figure 13:
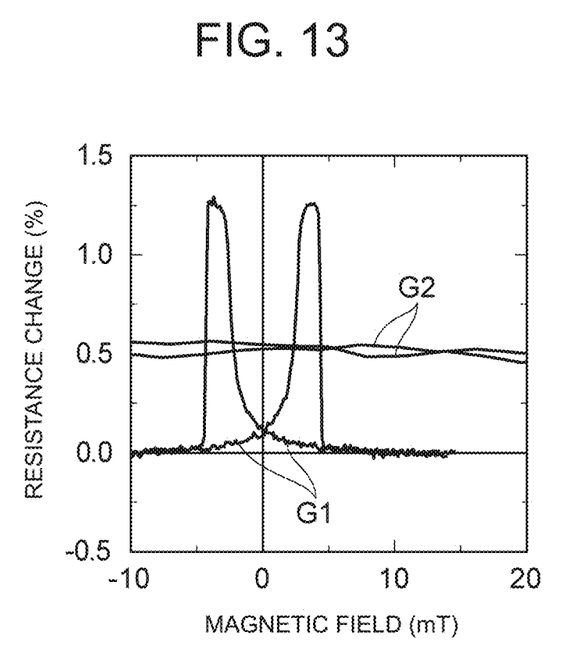
FIG. 13 is a chart illustrating a relationship between the magnetic field applied to the stress sensor and the resistance change in the Example 4.

FIG. 13 illustrates the results of measuring the resistance change when a tensile strain of $\varepsilon=1.2\%$ is applied to the stress sensor in the Example 4 after a magnetic field is externally applied. The tensile strain is applied in parallel or substantially in parallel to the x axis in FIG. 12. In FIG. 13, the abscissa represents a magnetic field externally applied, and the ordinate represents a resistance change of the stress sensor. In FIG. 13, graph G1 indicates the measurement results in a case where no tensile strain is applied, and graph G2 indicates the measurement results when a tensile strain is applied.

As illustrated in FIG. 13, since a resistance change occurs between a state where a tensile strain is applied (graph G2) and a state where no tensile strain is applied (graph G1), the strain is able to be detected. From the measurement results illustrated in FIG. 13, the strain is able to be detected even when a magnetic field is externally applied. However, even in such a state that the magnetic field is not externally applied (0 mT), since a resistance change depending on the presence or absence of the tensile strain occurs, the strain is able to be detected, and it is practical as a stress sensor.

The example preferred embodiments and examples of the present invention have been described above.

The stress sensors 10 according to the preferred embodiments each include the stress detection layer 3 including a laminated body formed by laminating the first magnetic layer 31, the first non-magnetic layer 30, and the second magnetic layer 32, where the first magnetic layer 31 and the second magnetic layer 32 have mutually different magnetoelastic coupling constants to detect a stress from an electrical resistance dependent on the relative angle of magnetization between the first magnetic layer 31 and the second magnetic layer 32 varying depending on the stress externally applied. According to the above structure, the stress is detected by detecting the electrical resistance dependent on the relative angle of magnetization between the first magnetic layer 31 and the second magnetic layer 32 varying depending on the stress externally applied.

Either one of the first magnetic layer 31 and the second magnetic layer 32 is a strain-insensitive layer the magnetization direction of which does not change depending on the stress externally applied, and the other one is a strain-sensitive layer the magnetization direction of which changes depending on the stress externally applied. Thus, only the magnetization direction of strain-sensitive layer changes depending on the stress externally applied. As a result, since the relative angle of magnetization between the first magnetic layer 31 and the second magnetic layer 32 is able to be detected based on the electric resistance value, the stress vector direction is eventually able to be detected.

Either one of the first magnetic layer 31 and the second magnetic layer 32 has a positive magnetoelastic coupling constant, and the other one has a negative magnetoelastic coupling constant. Thus, when any stress is externally applied, since the relative angle of magnetization between the first magnetic layer 31 and the second magnetic layer 32 changes to about 90°, the presence or absence of an in-plane stress is able to be detected.

In the initial state where no stress is applied, the first magnetic layer 31 and the second magnetic layer 32 are arranged so that the mutual magnetization directions will be parallel or substantially parallel, or antiparallel or substantially antiparallel to each other. Thus, the magnetization directions are aligned to be parallel or substantially parallel, or antiparallel or substantially antiparallel to each other in such an initial state, and this makes clear the difference in electrical resistance from the case where a stress is applied.

In addition to the laminated body, the stress detection layer 3 further includes a laminated body formed by laminating one or more structures each including a second non-magnetic layer and a third magnetic layer. Thus, the magnetoresistance change rate based on the giant magnetoresistance effect is able to be increased, and this makes it easy to detect a change in resistance based on the presence or absence of a stress.

The stress sensor includes the substrate 1 supporting the stress detection layer 3. Preferably, the substrate 1 is a flexible substrate. Thus, when a stress is applied to the stress sensor 10, the first magnetic layer 31 and the second magnetic layer 32 are susceptible to a tensile stress or compressive stress, and the stress is able to be detected.

Each of the first, second, and third magnetic layers is preferably made of metallic magnetic materials. The first, second, and the third magnetic layers include one material selected from a group of Fe, Co, Ni, and alloys containing Fe, Co, or Ni, for example. Using such 3 d transition metal ferromagnetic materials or alloys containing such materials, a stress sensor using the giant magnetoresistance effect is able to be achieved.

The first and second non-magnetic layers are metals or insulators. Thus, a stress sensor using the giant magnetoresistance effect is able to be achieved.

Note that each of the preferred embodiments described above is used to facilitate understand of the present invention, but not to limit the present invention. Changes/improvements may be made without departing from the scope of the present invention, and the present invention also includes equivalents. In other words, configurations obtained by adding design changes to each preferred embodiment by those skilled in the art are also included in the scope of the present invention as long as they include the features of the present invention. For example, respective elements and arrangements thereof, materials, conditions, shapes, sizes, and the like are not limited to those exemplified in each of the preferred embodiments, and may be changed appropriately. Further, the dimension ratio in each drawing is not limited to the illustrated ratio. Further, each preferred embodiment is an illustrative example, and partial replacement or combination of the structures illustrated in different preferred embodiments is possible and such structures are included in the scope of the present invention as long as they include the features of preferred embodiments of the present invention.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A stress sensor comprising:
a stress detection layer including a laminated body including a first magnetic layer, a first non-magnetic layer, and a second magnetic layer that are laminated; wherein
the first magnetic layer and the second magnetic layer have mutually different magnetoelastic coupling constants;
one of the first magnetic layer and the second magnetic layer is a strain-insensitive layer with an absolute value of the magnetoelastic coupling constant of about 0.5 MJ/m$^3$ or less, and another one of the first magnetic layer and the second magnetic layer is a strain-sensitive layer with an absolute value of the magnetoelastic coupling constant that is larger than the value of the strain-insensitive layer; and
a relative angle of magnetization between the first magnetic layer and the second magnetic layer varies depending on a stress externally applied thereto, and a strain direction is detected by a change in electrical resistance according to a direction of the stress externally applied.

2. The stress sensor according to claim 1, wherein one of the first magnetic layer and the second magnetic layer is a strain-insensitive layer, and an absolute value of the magnetoelastic coupling constant is about 0.1 MJ/m$^3$ or less.

3. The stress sensor according to claim 1, wherein the absolute value of the magnetoelastic coupling constant of the strain-sensitive layer is about 1 MJ/m$^3$ or more.

4. The stress sensor according to claim 1, wherein the magnetization directions of the first magnetic layer and the second magnetic layer are parallel or substantially parallel, or antiparallel or substantially antiparallel to each other in an initial state where no stress is applied.

5. The stress sensor according to claim 1, wherein the stress detection layer further includes another laminated body including one or more structures each defined by a second non-magnetic layer and a third magnetic layer that are laminated.

6. The stress sensor according to claim 1, further comprising a substrate to support the stress detection layer.

7. The stress sensor according to claim 6, wherein the substrate is a flexible substrate.

8. The stress sensor according to claim 5 wherein each of the first, second, and third magnetic layers is made of metallic magnetic materials.

9. The stress sensor according to claim 8, wherein each of the first, second, and third magnetic layers includes one material selected from a group of Fe, Co, Ni, and alloys including Fe, Co, or Ni.

10. The stress sensor according to claim 5, wherein the first and second non-magnetic layers are metals or insulators.

11. The stress sensor according to claim 7, wherein the flexible substrate is made of polyester, polycarbonate, or polyimide.

12. The stress sensor according to claim 1, further comprising a base layer on which the stress detection layer is disposed.

13. The stress sensor according to claim 12, wherein the base layer is made of Pt, Cu, Ta, or Au.

14. The stress sensor according to claim 1, further comprising a protective layer disposed on the stress detection layer.

15. The stress sensor according to claim 14, further comprising electrodes disposed on the protective layer.

16. The stress sensor according to claim 1, further comprising electrodes disposed on opposite side surfaces of the stress detection layer.

17. The stress sensor according to claim 14, wherein the protective layer is defined by an insulator.

18. The stress sensor according to claim 17, wherein the insulator is made of one of silicon oxide, silicon nitride, aluminum oxide, or magnesium oxide.

19. The stress sensor according to claim 12, further comprising:
a protective layer disposed on the stress detection layer;
an electrode disposed on the protective layer; and
another electrode disposed on the base layer.

20. The stress sensor according to claim 1, wherein a thickness of the first non-magnetic layer is about 5 nm or less.

* * * * *